United States Patent
Yamamoto

(10) Patent No.: US 7,397,393 B2
(45) Date of Patent: Jul. 8, 2008

(54) ENCODER COUNT ERROR DETECTION CIRCUITRY AND ENCODER COUNT ERROR DETECTION METHOD

(75) Inventor: Takeshi Yamamoto, Hachioji (JP)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 11/636,112

(22) Filed: Dec. 8, 2006

(65) Prior Publication Data

US 2007/0152856 A1    Jul. 5, 2007

(30) Foreign Application Priority Data

Dec. 8, 2005    (JP)    ............... 2005-354205

(51) Int. Cl.
*H03M 1/22*    (2006.01)
(52) U.S. Cl. ............................................. 341/7; 341/11
(58) Field of Classification Search .................. 341/7, 341/9, 11, 15; 702/125
See application file for complete search history.

(56) References Cited

U.S. PATENT DOCUMENTS 5,170,645 A    12/1992    Lonati et al.
7,209,853 B2 *    4/2007    Nagai ........................ 702/125
7,359,473 B2 *    4/2008    Tanaka ....................... 375/375

FOREIGN PATENT DOCUMENTS

| JP | 6-41853 | 2/1994 |
| JP | 7-218290 | 8/1995 |
| JP | 10-325740 | 12/1998 |

* cited by examiner

*Primary Examiner*—Peguy JeanPierre
(74) *Attorney, Agent, or Firm*—Kenyon & Kenyon LLP

(57) ABSTRACT

To provide encoder count error detection circuitry and an encoder count error detection method capable of realizing a highly reliable encoder by providing detection of the count errors of count signals used to measure displacement, an encoder count error detection circuitry and detection method configured as count error detection circuitry for an encoder outputting pulse trains according to the displacement of a measured object, doubles, triples, or quadruples one or more fundamental signals used for measuring displacement to convert to count signals, and compares the output signals of the counter counting these count signals with the level of these fundamental signals to detect count errors in the count signals.

4 Claims, 4 Drawing Sheets

ENCODER COUNT ERROR DETECTION CIRCUITRY AND ENCODER COUNT ERROR DETECTION METHOD

CROSS-REFERENCE TO RELATED APPLICATIONS

The present application claims priority to Application No. 2005-354205, filed in Japan on Dec. 8, 2005, which is expressly incorporated herein in its entirety by reference thereto.

FIELD OF THE INVENTION

The present invention relates to an encoder attached to a measured object, e.g., a rotating body such as a motor or a moving body such as a movable table of a machine tool, for detecting the displacement (e.g., the number of rotations and/or the angle of rotation) or the moving distance of the measured object and to a circuit for detecting the count errors of a counter for quantifying movement.

BACKGROUND INFORMATION

Encoders are usually classified as rotary encoders and linear encoders, and rotary encoders are further classified as incremental encoders and absolute encoders. In particular, absolute encoders include multiple rotation-type encoders which detect the number of rotations. As described, for example, in Japanese Published Patent Application No. 6-41853, some multiple rotation encoders have mechanisms for detecting the displacement and angle of displacement within a single rotation, and some have mechanisms for detecting the number of rotations in more than one rotation.

The multiple rotation encoder described in Japanese Published Patent Application No. 6-41853 is equipped with an optical absolute value encoder for detecting the absolute angle within a single rotation, and a magnetic encoder for detecting multiple rotations. The optical absolute value encoder for detecting the absolute angle within a single rotation includes a rotating disk attached to the shaft for detecting the absolute angle within a single rotation, an LED for projecting light to this disk, a light receiving element photodiode array for receiving light from this LED through a stationary slit, and a waveform shaping circuit for shaping the waveforms of the detected signals from this photodiode array, among other parts. The magnetic encoder for detecting multiple rotations includes a rotating disk equipped with a magnet (a so-called "ring magnet") on the rotating part, a magnetic resistance element for detecting the rotation of this rotating disk, a waveform shaping circuit for shaping the waveforms of the signals from this magnetic resistance element, and a control circuit (counter) for counting the detected signals of multiple rotations and storing numerical values, among other parts.

Because magnetic poles reverse during one rotation, the rotation of the ring magnet can be detected by the magnetic resistance element by detecting change in these magnetic poles. Moreover, the mechanisms of such an encoder for detecting a single rotation and multiple rotations may be either optical or magnetic mechanisms, and such aspects as the structure and attachment location of their parts have various arrangements depending on the type of encoder.

As described, for example, in Japanese Published Patent Application No. 7-218290, only an optical system may be used for the detection mechanism and an optical system may be used to generate the signals used for detecting multiple rotations.

As described in Japanese Published Patent Application No. 10-325740, only an optical system may be used for the detection mechanism and the high-order bits of absolute signals may be used for the signals used to detect multiple rotations. Encoders where the multiple rotation detection part is magnetic are usually considered better because they may run with less power and may provide for prolonging the lifetime of the backup power.

Whichever system is used, the fundamental signals used to detect multiple rotations, as illustrated in FIG. 6, usually include Phase A and Phase B signals which differ in electrical angle by a 90° phase and complete one cycle per single rotation. Using signals with such a phase difference makes it possible to detect the direction of rotation and count the number of rotations according to the direction of rotation. Thus, FIG. 6 is a timing chart showing the state of each fundamental signal used to detect multiple rotations.

Because one count per single rotation may be used when using such fundamental signals to count the number of rotations, the change points for either the Phase A or Phase B signal is normally used to count the number of rotations. FIG. 7 is a timing chart using the Phase A and Phase B signals and the three low-order bit outputs Count (0) to Count (2) outputted by the counter to show the operation of such multiple rotation counting. In this example, a rotation is counted by detecting the rising edge of the Phase A signal. If the direction of rotation is clockwise, the count outputs Count (0) to Count (2) of the counter are incremented at each rising edge of the Phase A signal, and the number of rotations is counted as "0, 1, 2, 3..."

However, if an occurrence such as pulse breakup due to noise or oscillation makes it impossible to detect the rising edge of Phase A, this produces a count error as illustrated in FIG. 8, but inability to recognize count errors from the states of the Phase A and Phase B signals and the count outputs Count (0) to Count (2) may lead to overlooking count errors. Thus, FIG. 8 is a timing chart illustrating the state when a detection error (NG) occurs at an edge of Phase A in FIG. 7.

More precisely, such problems occur because when the levels of the Phase A and Phase B signals change as shown in Table 1, the corresponding states of the count output Count (0) can be both 0 and 1, and the correlation between these make it impossible to detect count errors.

TABLE 1

| Phase A | Phase B | Count (0) |
| --- | --- | --- |
| 0 | 0 | 0/1 |
| 1 | 0 | 0/1 |
| 0 | 1 | 0/1 |
| 1 | 1 | 0/1 |

When such a detection error occurs in the multiple rotation part of a multiple rotation encoder, it constitutes a single rotation error, which is an error the extremely high figure for position control data of which runs the risk of creating fatal problems.

Although the same manner of counting using the Phase A and Phase B signals is also used by these incremental encoders and absolute encoders to detect displacement in a single rotation, this case also risks generating count errors in the same manner. Consequently, such count errors must be prevented to improve the reliability of encoders.

SUMMARY

Example embodiments of the present invention provide encoder count error detection circuitry and an encoder count error detection method that may be capable of realizing a highly reliable encoder by providing detection of the count errors of count signals used to measure displacement.

According to an example embodiment of the present invention, an encoder count error detection circuitry, e.g., a count error detection circuitry for an encoder outputting pulse trains according to the displacement of a measured object, which doubles, triples, or quadruples one or more fundamental signals used for measuring displacement to convert to count signals, and compares the output signals of the counter counting these count signals with the level of these fundamental signals to detect count errors in the count signals.

The encoder count error detection circuitry may be arranged for detecting the count errors in the rotation-detecting part of a multiple rotation-type absolute value encoder.

According to an example embodiment of the present invention, an encoder count error detection circuitry includes an n-multiplication circuit for doubling, tripling, or quadrupling one or more fundamental signals used for measuring displacement, a count signal transforming circuit for converting the multiplied fundamental signals to count signals for counting, a counter for counting count signals, a comparison signal-generating selection circuit for generating comparison signals from these fundamental signals for comparison with the output signals of the counter, and a comparator for comparing the comparison signals with the level of the output signals of the counter to generate count error output signals if a specific relationship occurs.

According to an example embodiment of the present invention, an encoder count error detection circuitry for an encoder adapted to output pulse trains according to displacement of a measured object includes: a device adapted to one of (a) double, (b) triple and (c) quadruple at least one fundamental signal used to measure displacement to convert to count signals; and a comparator adapted to compare output signals of a counter adapted to count the count signals with a level of the fundamental signals to detect count errors in the count signals.

The encoder count error detection circuitry may be adapted to detect count errors in a rotation-detection part of a multiple rotation-type absolute value encoder.

According to an example embodiment of the present invention, an encoder count error detection circuitry includes: an n-multiplication circuit adapted to one of (a) double, (b) triple and (c) quadruple at least one fundamental signals used for measurement of displacement; a count signal transformation circuit adapted to convert multiplied fundamental signals to count signals for counting; a counter adapted to count count signals; a comparison signal-generation selection circuit adapted to generate comparison signals from the fundamental signals for comparison with output signals of the counter; and a comparator adapted to compare comparison signals with a level of the output signals of the counter to generate count error output signals if a specific relationship occurs.

According to an example embodiment of the present invention, an encoder count error detection method, e.g., a count error detection method for an encoder outputting pulse trains according to the displacement of a measured object, doubles, triples, or quadruples one or more fundamental signals used for measuring displacement to convert to count signals, compares the output signals of the counter counting these count signals with the level of these fundamental signals, and generates the count errors of the count signals if a specific relationship occurs.

According to an example embodiment of the present invention, an encoder count error detection method for an encoder outputting pulse trains according to displacement of a measured object includes: one of (a) doubling, (b) tripling and (c) quadrupling at least one fundamental signal used for measuring displacement to convert to count signals; comparing output signals of a counter counting count signals with a level of the fundamental signals; and generating count errors of the count signals if a specific relationship occurs.

Further features and aspects of example embodiments of the present invention are described in more detail below with reference to the appended Figures.

DETAILED DESCRIPTION

Example embodiments of the present invention may provide an encoder count error detection circuitry and an encoder count error detection method capable of realizing a very highly reliable encoder using a simple configuration to provide detection of count errors during measurements while making only slight modifications in conventional circuitry.

The encoder count error detection circuitry may be arranged as a count error detection circuitry for an encoder outputting pulse trains according to the displacement of measured objects, such as rotation or motion. This circuitry doubles, triples, or quadruples one or more fundamental signals used for measuring displacement and outputted according to this displacement to convert to count signals, and compares the output signals of the counter counting these count signals with the levels of the fundamental signals to detect count errors in the count signals.

The encoder count error detection method may be a count error detection method for an encoder outputting pulse trains according to the displacement of a measured object. This method doubles, triples, or quadruples one or more fundamental signals used for measuring displacement to convert to count signals, compares the output signals of the counter counting these count signals with the level of these fundamental signals, and generates the count errors of the count signals if a specific relationship occurs.

By doubling, tripling, or quadrupling a fundamental signal used for measuring displacement to convert to a count signal, this count signal comes to have a specific relationship with the level of one of the signals, e.g., one of the two low-order bits, outputted by the counter. Therefore, comparing both makes possible to assess normal-state and abnormal-state relationships, and to detect the count errors.

Figure 1:
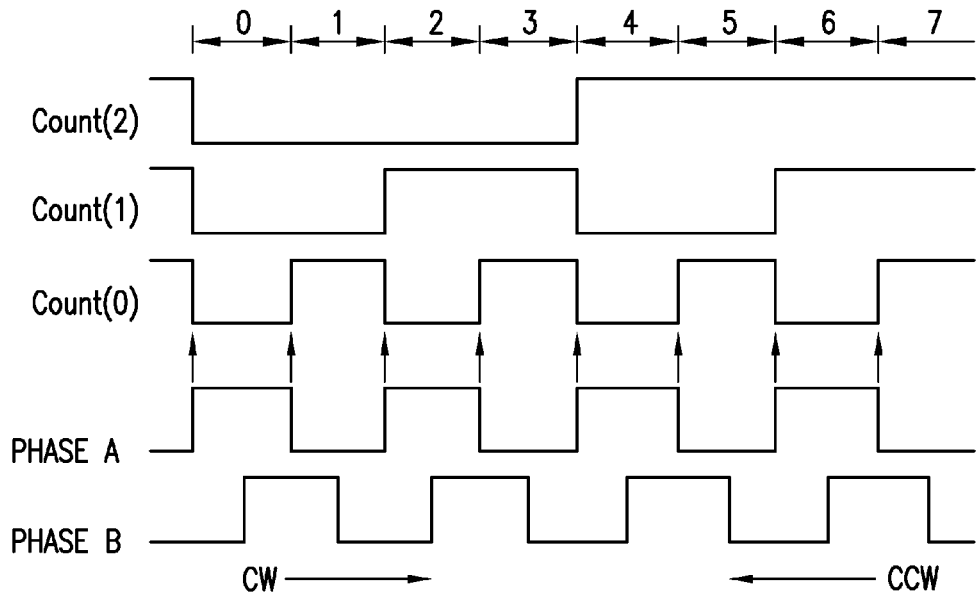
FIG. 1 is a timing chart showing the operation of an example embodiment of the present invention, using the output of the Phase A and Phase B signals and the three low-order bits outputted by the counter to show the operation for counting displacement.

A device according to an example embodiment of the present invention is described in greater detail while referring to the Figures. FIG. 1 is a timing chart showing the operation of an example embodiment of the present invention and uses the Phase A and Phase B signals and the three low-order bit outputs Count (0) to Count (2) outputted by the counter, to show the operation for counting displacement, e.g., the angle of rotation, the number of rotations, the amount of motion, etc. In this example, involving detection of rotation by a rotary encoder, the rising and falling edges of the Phase A signal are detected to convert to count signals. This same approach may also be applied to linear encoders by using direction of rotation instead of direction of motion.

If generated by detecting the rising and falling edges of the Phase A signal, for example, from among the fundamental signals of Phase A and Phase B, the count signals become doubled signals of the Phase A signal. If the direction of rotation is clockwise, the count outputs Count (0) to Count (2) of the counter are incremented for each rising and falling edge of the Phase A signal, and the number of rotations is counted as "0, 1, 2, 3..." Therefore, the least significant bit (LSB) output signal Count (0) of the counter counting becomes the anti-phase signal of the Phase A signal so as to match this doubled count signal. In other words, as shown in Table 2 below, the level of the least significant bit (LSB) output signal Count (0) matches the anti-phase of the Phase A signal, e.g., the logical negative level.

TABLE 2

| Phase A | Phase B | Count (0) |
|---------|---------|-----------|
| 0 | 0 | 1 |
| 1 | 0 | 0 |
| 0 | 1 | 1 |
| 1 | 1 | 0 |

Figure 2:
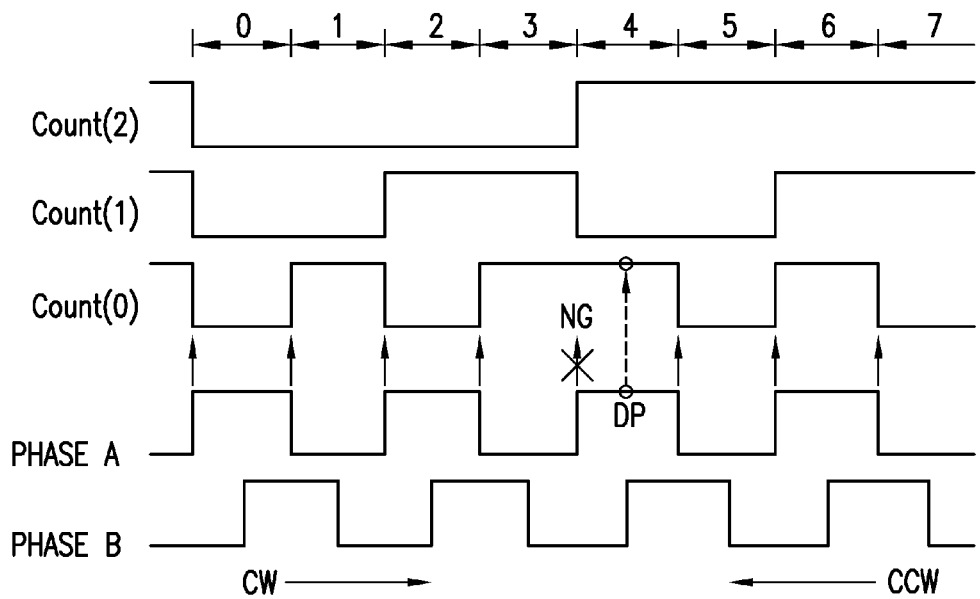
FIG. 2 is timing chart showing the state when a detection error occurs at the rising edge of Phase A in FIG. 1.

Next, as illustrated in FIG. 2, if a detection error (NG) occurring at the rising edge of Phase A causes a count error, the level of the least significant bit (LSB) output signal Count (0) does not change and matches the Phase A signal level. Consequently, by setting the detection point (DP) at a suitable location, where the signal level stabilizes, and comparing the level of both signals, a count error may be detected by verifying that these levels match. More specifically, obtaining the logical product (AND) or the exclusive logical sum (XOR) of both signals may facilitate assessment.

Moreover, in the example above, the rising and falling edges of the Phase A signal are detected to convert to doubled count signals, but the same applies to using the Phase B signal. The rising edges of Phase A and Phase B or the falling edges of Phase A and Phase B may also be used to convert to doubled signals. In other words, the same techniques may be used for processing so long as either of the fundamental signals is doubled to generate a count signal involving two counts per single rotation when applied, for example, to the multiple rotation part of rotary encoders. The same is also true for counting incremental signals.

Figure 3:
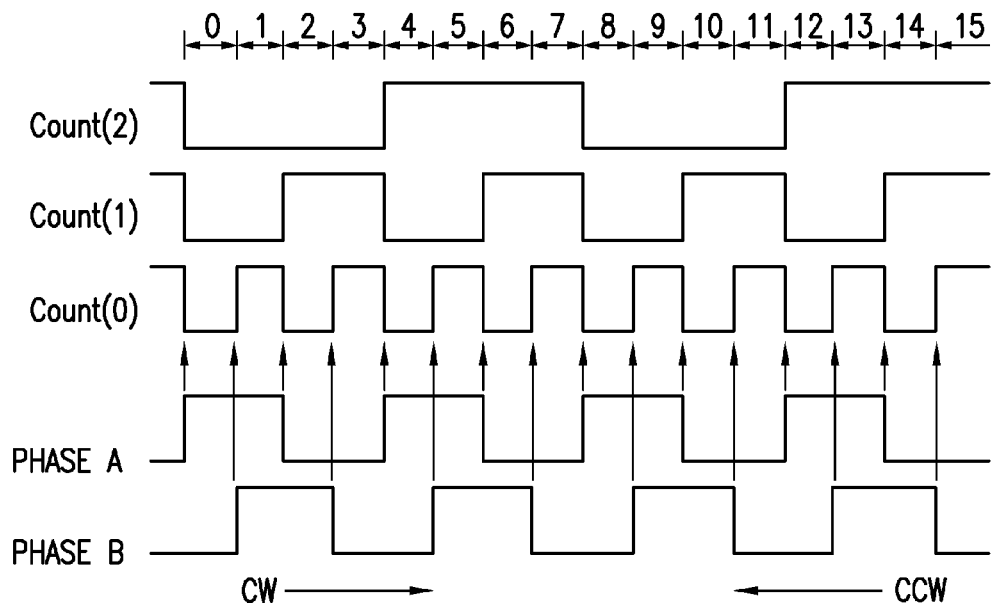
FIG. 3 is a timing chart showing the operation of an example embodiment of the present invention, using the output of the Phase A and Phase B signals and the three low-order bits outputted by the counter to show the operation for counting displacement.

FIG. 3 is a timing chart showing the operation of an example embodiment of the present invention. In this example, the rising and falling edges of the Phase A signal and the rising and falling edges of the Phase B signal are detected and counted.

If generated by detecting the rising and falling edges of the Phase A signal and the rising and falling edges of the Phase B signal from among the fundamental signals of Phase A and Phase B, the count signals become quadrupled signals of the Phase A signal and Phase B signal. If the direction of rotation is clockwise, the count outputs Count (0) to Count (2) of the counter are incremented for each rising and falling edge of the Phase A signal, and the number of rotations is counted as "0, 1, 2, 3..." Therefore, the least significant bit (LSB) output signal Count (0) of the counter counting matches the quadrupled signal.

Additionally, the level of the least significant bit +1 output signal Count (1) from this counter matches the level of the logical negative for the Phase A signal. Therefore, as shown in Table 3 below, the level of the least significant bit (LSB) Count (0) matches the exclusive logical sum or its negative of the signal levels of Phase A and Phase B, and level of the output signal Count (1) either matches the level of the Phase A or Phase B signal or matches the level of their anti-phase, e.g., the logical negative level.

TABLE 3

| Phase A | Phase B | Count (0) | Count (1) |
|---------|---------|-----------|-----------|
| 0 | 0 | 1 | 1 |
| 1 | 0 | 0 | 0 |
| 0 | 1 | 0 | 1 |
| 1 | 1 | 1 | 0 |

Figure 4:
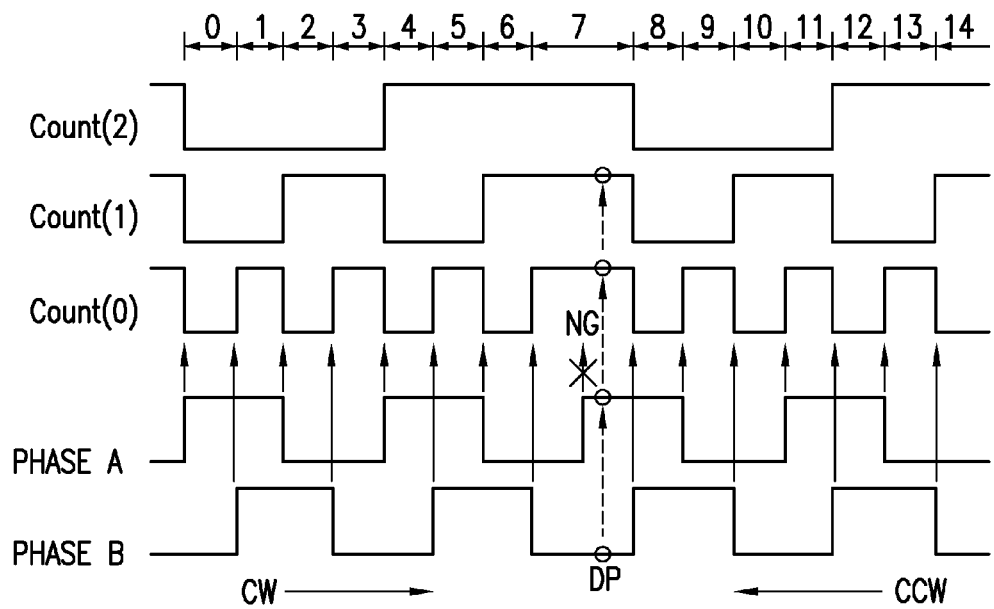
FIG. 4 is a timing chart showing the state when a detection error occurs at the rising edge of Phase A in FIG. 3.

As illustrated in FIG. 4, if a detection error (NG) occurring at the rising edge of Phase A causes a count error, the level of the least significant bit (LSB) output signal Count (0) does not change. Therefore, the level of the least significant bit +1 output signal Count (1) matches the level of the Phase A signal. Moreover, the level of the least significant bit (LSB) output signal Count (0) matches the exclusive logical sum of the Phase A and Phase B signal levels.

Consequently, by setting the detection point (DP) at a suitable location where the signal level stabilizes and comparing the Phase A and Phase B signal levels with the levels of the least significant bit (LSB) output signal Count (0) and the least significant bit +1 output signal Count (1), a count error may be detected by verifying that the level of the least significant bit +1 output signal Count (1) matches the Phase A signal level, or the level of the least significant bit (LSB) output signal Count (0) matches the exclusive logical sum of the Phase A and Phase B signal levels. The device for detecting these may detect either the level of the least significant bit +1 output signal Count (1) or the level of the least bit (LSB) output signal Count (0), or both. Detecting both produces a dual test, which may markedly improve device safety.

Moreover, in the example above, the rising and falling edges of the Phase A and Phase B signals are detected to convert to quadrupled count signals, but three edges out of the rising and falling edges of the Phase A and Phase B signals may also be used to convert to tripled signals. In other words, the same techniques may be used for processing so long as if one triples or quadruples either of the fundamental signals is tripled or quadrupled to generate a count signal involving three or four counts per single rotation when applied, for example, to the multiple rotation part of rotary encoders.

The same also applies to the incremental signals used by rotary encoders and linear encoders for detecting displacement, e.g., the angle of rotation or the amount of motion. This is also applicable to the least significant bit of an absolute signal or high-order bits used for detecting rotation.

Figure 5:
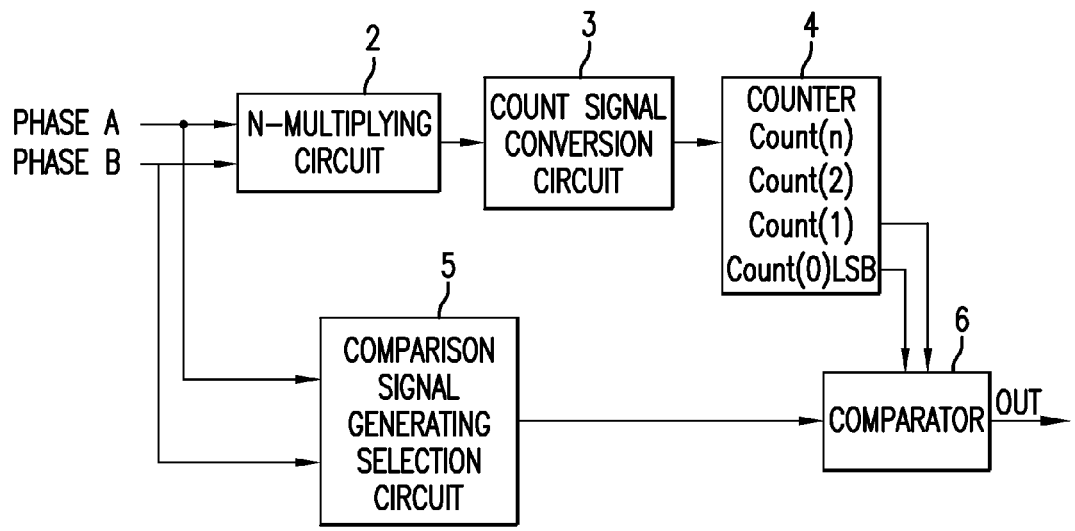
FIG. 5 is a block diagram showing the basic configuration of the encoder count error detection circuitry of an example embodiment of the present invention.
Figure 6:
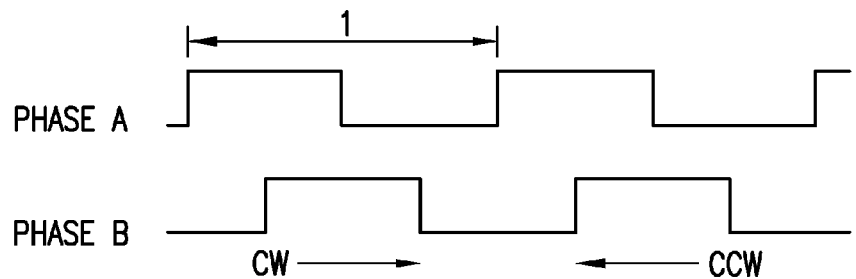
FIG. 6 is a timing chart showing the states of the fundamental signals used for detecting the multiple rotations of a conventional encoder.
Figure 7:
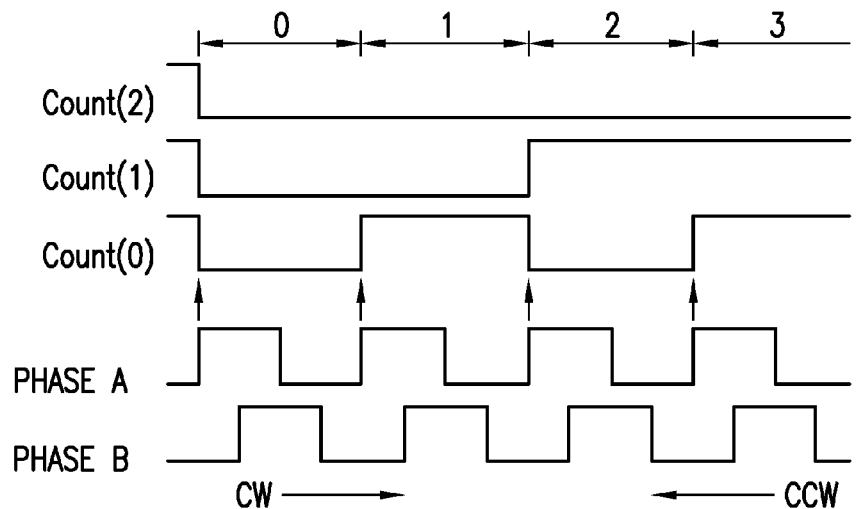
FIG. 7 is timing chart using the output of the Phase A and Phase B signals and the three low-order bits outputted by the counter to show the operation for counting the multiple rotations of the encoder illustrated in FIG. 6.
Figure 8:
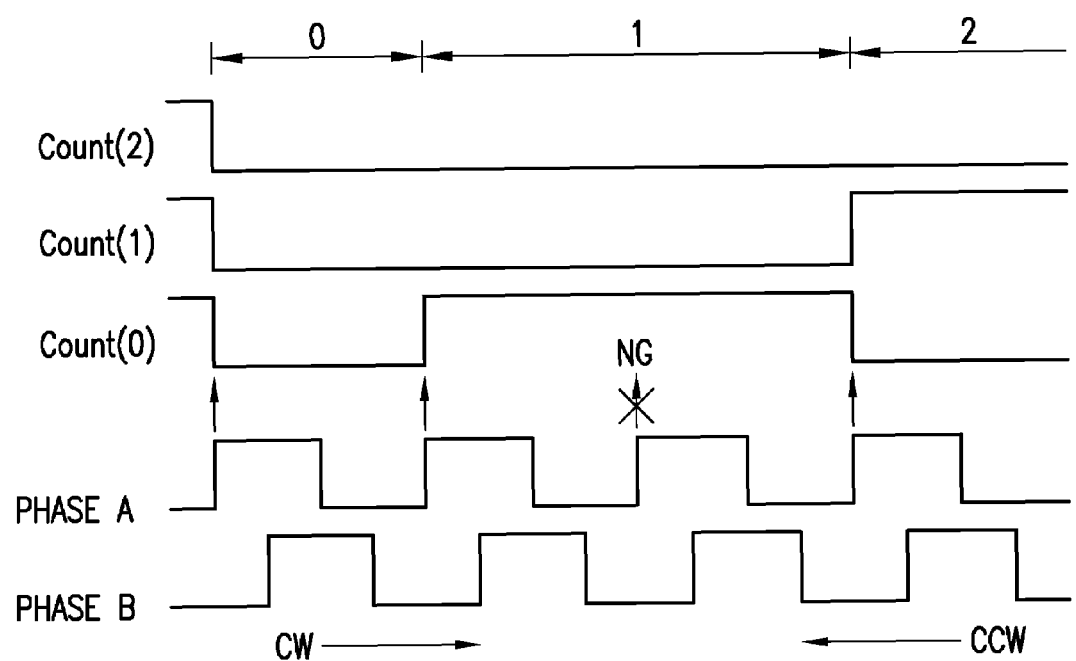
FIG. 8 is a timing chart showing the state when a detection error occurs at the rising edge of Phase A in FIG. 7.

A device according to an example embodiment of the present invention is described with reference to FIG. 5. FIG. 5 is a block diagram of the basic configuration of encoder count error detection circuitry. The count error detection circuitry includes an n-multiplying circuit 2 for doubling, tripling, or quadrupling Phase A and Phase B signals outputted from a displacement detecting part, a count signal conversion circuit 3 for generating count signals for addition (Up) or subtraction (Down) from these n-multiplied Phase A and Phase B signals, a counter 4 for counting these count signals to generate count output according to the count value, a comparison signal-generating selection circuit 5 for generating comparison signals for comparing with this count output from these Phase A and Phase B signals, and a comparator 6 for comparing the count output signals from this counter with the comparison signals to convert these results to count error signals for output.

The n-multiplying circuit 2 as described above, detects the rising or falling edges of Phase A or Phase B or both Phase A and Phase B to generate n-multiplied signals from these fundamental signals. The n-multiplying circuit 2 uses digital circuitry elements which operate at the rising and falling edges, for example, flip-flop elements. Application of these may facilitate configuration.

The count signal conversion circuit 3 uses the phase relationship of Phase A and Phase B from the n-multiplied fundamental signal to distinguish the direction of rotation and the direction of motion, and, generates count signals for addition (Up) or subtraction (Down) according to this direction of rotation or direction of motion. For example, in the example above, if the direction of rotation is clockwise, the pulses appear in the order of Phase B then Phase A, and if the direction of rotation is counter-clockwise, the pulses appear in the reverse of this order. Consequently, addition signals may be generated if the pulses appear in the order of Phase B then Phase A, and subtraction signals may be generated if the pulses appear in the reverse of this order. Furthermore, the direction of motion may be substituted for the direction of rotation when using a linear encoder. Such count signal conversion circuits may also be configured according to conventional circuits.

The counter 4 counts the inputted count signals. During this counting, count values are incremented when addition (Up) signals are inputted, and decremented when subtraction (Down) signals are inputted. This counter 4 may also be configured by combining conventional counter elements or logic elements. The multiple rotation capacity (e.g., number of outputted bits) of this counter should be increased to handle the multiplied portion of the bit count so that the count signals become the n-multiple of the fundamental signals. For example, if the number of outputted bits when doubling is 16 bits, the multiplied portion of the bit count requires one bit, so the count capacity becomes 17 bits.

The comparison signal-generating selection circuit 5 selects signals which may be compared with the count output of the counter 4 from the fundamental signals of the Phases A and B, and performs operations such as taking the logical negative, logical product, or exclusive logical sum of these signals to convert to comparison signals which may be compared with the count output.

The comparator 6 compares the least significant bit (LSB) count signal Count (0) or the least significant bit +1 count signal Count (1) from the counter 4 with the comparison signals from this comparison signal-generating selection circuit 5 to generate count error output signals (OUT) capable of assessing the presence or absence of detection errors. For the signals to be compared, to avoid unstable states such as changes in rise and fall of displacement detection signals or changes in the counter, it may be provided to compare the levels of that portion of the displacement detection signals and counter output signals which are stable. Conventional comparison elements of comparators, for example, may be used for the comparator, but since generating an output when the levels of only two of the signals have a specific relationship is sufficient, the comparator may be configured simply by using, for example, a logic element having functions such as logical product and exclusive logical product functions.

Count error detection circuitry with such a configuration is applied to the multiple rotation detecting part of a multiple rotation absolute value encoder, for example, and is effective in detecting multiple rotation miscounts. The multiple rotation absolute value encoder may be arranged as described in the literature mentioned above., e.g., Japanese Published Patent Application No. 6-41853. This encoder is equipped with an optical absolute value encoder for detecting the absolute angle within a single rotation and a magnetic encoder for detecting multiple rotations. The optical absolute value encoder includes a rotating disc attached to a shaft for detecting the absolute angle within a single rotation, an LED for projecting light to this disk, a light-receiving element photodiode array for receiving light from this LED through a stationary slit, and a waveform shaping circuit for shaping the waveforms of these detected signals from the photodiode array, among other parts. The magnetic encoder for detecting multiple rotations includes a rotating disk equipped with a magnet (a so-called "ring magnet") on the rotating part, a magnetic resistance element for detecting the rotation of this rotating disk, a waveform shaping circuit for shaping the waveforms of the signals from this magnetic resistance element, and a control circuit (counter) for counting the detected signals of multiple rotations and storing numerical values, among other parts.

Additionally, the signals outputted by this waveform shaping circuit for shaping the waveforms of the signals from this magnetic resistance element corresponds to the fundamental signals of Phase A and Phase B, and the control circuit corresponds to the counter.

Moreover, the count error detection circuitry and detection method are applicable not only to the multiple rotation part of multiple rotation encoders but also, using the same techniques, to incremental encoders and linear encoders. Detailed configuration of these encoders is not provided but may be found in myriad sources.

The absolute encoder count error detection circuitry and detection method are applicable to any type of encoder, provided that it can output certain pulse trains according to the displacement and use these to measure displacement. This circuitry and method are applicable to a variety of count functions for encoders: for example, the incremental signal count, absolute signal count, and multiple rotation signal count of rotary encoders, or the incremental signal count for linear encoders.

LIST OF REFERENCE CHARACTERS

2 N-multiplying Circuit
3 Count signal conversion circuit
4 Counter
5 Comparison signal-generating selection circuit
6 Comparator

What is claimed is:

1. An encoder count error detection circuitry for an encoder adapted to output pulse trains according to displacement of a measured object, comprising:
   a device adapted to one of (a) double, (b) triple and (c) quadruple at least one fundamental signal used to measure displacement to convert to count signals; and
   a comparator adapted to compare output signals of a counter adapted to count the count signals with a level of the fundamental signals to detect count errors in the count signals.

2. The encoder count error detection circuitry according to claim 1, wherein the encoder count error detection circuitry is adapted to detect count errors in a rotation-detection part of a multiple rotation-type absolute value encoder.

3. An encoder count error detection circuitry, comprising:
   an n-multiplication circuit adapted to one of (a) double, (b) triple and (c) quadruple at least one fundamental signals used for measurement of displacement;
   a count signal transformation circuit adapted to convert multiplied fundamental signals to count signals for counting;
   a counter adapted to count count signals;
   a comparison signal-generation selection circuit adapted to generate comparison signals from the fundamental signals for comparison with output signals of the counter; and
   a comparator adapted to compare comparison signals with a level of the output signals of the counter to generate count error output signals if a specific relationship occurs.

4. An encoder count error detection method for an encoder outputting pulse trains according to displacement of a measured object, comprising:
   one of (a) doubling, (b) tripling and (c) quadrupling at least one fundamental signal used for measuring displacement to convert to count signals;
   comparing output signals of a counter counting count signals with a level of the fundamental signals; and
   generating count errors of the count signals if a specific relationship occurs.

* * * * *